(12) United States Patent
Tanaka et al.

(10) Patent No.: US 9,351,422 B2
(45) Date of Patent: May 24, 2016

(54) PACKAGE FOR HOUSING ELECTRONIC COMPONENT AND ELECTRONIC DEVICE

(71) Applicant: KYOCERA Corporation, Kyoto-shi, Kyoto (JP)

(72) Inventors: Nobuyuki Tanaka, Moriyama (JP); Shigenori Takaya, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 46 days.

(21) Appl. No.: 14/374,310

(22) PCT Filed: Jan. 22, 2013

(86) PCT No.: PCT/JP2013/051201
§ 371 (c)(1),
(2) Date: Jul. 24, 2014

(87) PCT Pub. No.: WO2013/111752
PCT Pub. Date: Aug. 1, 2013

(65) Prior Publication Data
US 2014/0368998 A1    Dec. 18, 2014

(30) Foreign Application Priority Data

Jan. 24, 2012 (JP) .................. 2012-011646
Feb. 17, 2012 (JP) .................. 2012-032692
Feb. 17, 2012 (JP) .................. 2012-032693

(51) Int. Cl.
| H05K 5/00 | (2006.01) |
|---|---|
| H05K 7/00 | (2006.01) |
| H05K 7/20 | (2006.01) |
| H01L 23/04 | (2006.01) |
| H01L 23/047 | (2006.01) |
| H05K 1/02 | (2006.01) |
| H01L 23/36 | (2006.01) |
| H01L 23/40 | (2006.01) |
| H01L 23/10 | (2006.01) |
| H05K 3/30 | (2006.01) |

(52) U.S. Cl.
CPC .............. *H05K 7/2039* (2013.01); *H01L 23/04* (2013.01); *H01L 23/047* (2013.01); *H01L 23/10* (2013.01); *H01L 23/36* (2013.01); *H01L 23/4006* (2013.01); *H05K 1/0203* (2013.01); *H01L 2924/0002* (2013.01); *H05K 3/303* (2013.01); *H05K 2201/097* (2013.01); *H05K 2201/10409* (2013.01); *H05K 2201/10628* (2013.01)

(58) Field of Classification Search
CPC .................................................. H01M 10/425
USPC ......... 361/728, 730, 731, 732, 733, 752, 756, 361/759, 729
See application file for complete search history.

(56) References Cited

U.S. PATENT DOCUMENTS

| 2012/0057316 A1* | 3/2012 | Kaneshige .......... H01M 2/1072 361/752 |
|---|---|---|
| 2012/0075810 A1* | 3/2012 | Katada .................... G01P 1/023 361/728 |
| 2012/0236214 A1* | 9/2012 | Takeguchi ................ H04N 5/64 348/836 |
| 2013/0010442 A1* | 1/2013 | Heim ...................... H05K 1/162 361/752 |
| 2013/0128467 A1* | 5/2013 | Tsujino ............. H01L 23/49811 361/728 |
| 2015/0004442 A1* | 1/2015 | Saxe ................. H01M 10/0436 429/8 |

FOREIGN PATENT DOCUMENTS

JP    2004-253409    9/2004

OTHER PUBLICATIONS

International Search Report (Form PCT/ISA/210) dated Mar. 12, 2013 issued for PCT/JP2013/051201.

* cited by examiner

*Primary Examiner* — Anthony Haughton
(74) *Attorney, Agent, or Firm* — Volpe and Koenig, P.C.

(57) ABSTRACT

A package 10 includes a housing 1 in which an electronic component 5 is mounted in a recess 1a having an opening on an upper surface and a screwing section 31 that is fixed on a side face of the housing 1 and extends in a lateral direction. The screwing section 31 includes a thin section 34 which is located on a distal end and is provided with a through hole 36 through which a screw is inserted, a thick section 35 which is located between the thin section 34 and the side face of the housing 1 and has a thickness less than that of the side face of the housing 1 and thicker than that of the thin section 34, and a screw fastening hole 37 which extends in the vertical direction in the thick section 35. Even if the housing 1 has warpage when the package 10 is fixed on the external substrate, heat dissipation from the package to the external substrate can be improved.

6 Claims, 8 Drawing Sheets

PACKAGE FOR HOUSING ELECTRONIC COMPONENT AND ELECTRONIC DEVICE

TECHNICAL FIELD

The present invention relates to a package for housing electronic component and an electronic device.

BACKGROUND ART

A package for housing electronic component (hereinafter, also simply referred to as a package) that houses an electronic component is known, for example, as described in PTL 1. The package described in PTL 1 includes screwing sections at four corners to mount a substrate on an external substrate.

In the package described in PTL 1, a stepped section is formed between a portion of the substrate where a frame is attached and the screwing sections with the upper surface on the screwing section side being lower. The screwing section, which is located distal to the stepped section, has a smaller thickness. Accordingly, the screwing section tends to be deformed when the package is attached to the external substrate.

CITATION LIST

Patent Literature

PTL 1: Japanese Unexamined Patent Application Publication No. 2004-253409

SUMMARY OF INVENTION

Technical Problem

However, since the screwing section tends to be deformed, the warpage of the substrate is not easily corrected in the package described in PTL 1. When the substrate is warped upward or downward in an arch, the lower surface of the substrate and the external substrate are not allowed to be in contact with each other by a large contact area. As a result, heat dissipation from the substrate to the external substrate becomes difficult.

The present invention is made in light of the above problem, and an object of the present invention is to provide a package having improved heat dissipation property.

Solution to Problem

A package for housing electronic component according to one embodiment of the present invention includes a housing in which an electronic component is to be mounted in a recess having an opening on an upper surface, and a screwing section that is fixed on a side face of the housing and extends in a lateral direction. The screwing section includes a thin section which is located on a distal end and is provided with a through hole through which a screw is inserted, a thick section which is located between the thin section and the side face of the housing and has a thickness less than that of the side face of the housing in the vertical direction and thicker than that of the thin section in the vertical direction, and a screw fastening hole which extends in the vertical direction in the thick section.

An electronic device according to one embodiment of the present invention includes the package for housing electronic component, an electronic component which is mounted in the recess of the package for housing electronic component, and a cover which is joined to an upper surface of the housing to close the opening.

Advantageous Effects of Invention

According to the package for housing electronic component and the electronic device of one embodiment of the present invention, the screwing section includes a thin section which is provided with a through hole, a thick section which has a thickness less than that of the side face of the housing in the vertical direction and thicker than that of the thin section in the vertical direction, and a screw fastening hole which extends in the vertical direction in the thick section. When the package is screwed down to an external substrate in the thick section, the warpage of the housing is allowed to be easily corrected. As a result, a contact area between the housing and the external substrate increases, which facilitates heat dissipation from the housing to the external substrate.

DESCRIPTION OF EMBODIMENTS

A package for housing electronic component 10 and an electronic device 100 according to one embodiment of the present invention will be described with reference to the drawings. All figures are schematic views and are not drawn to scale.

<Configuration of Package for Housing Electronic Component 10>

Figure 1:
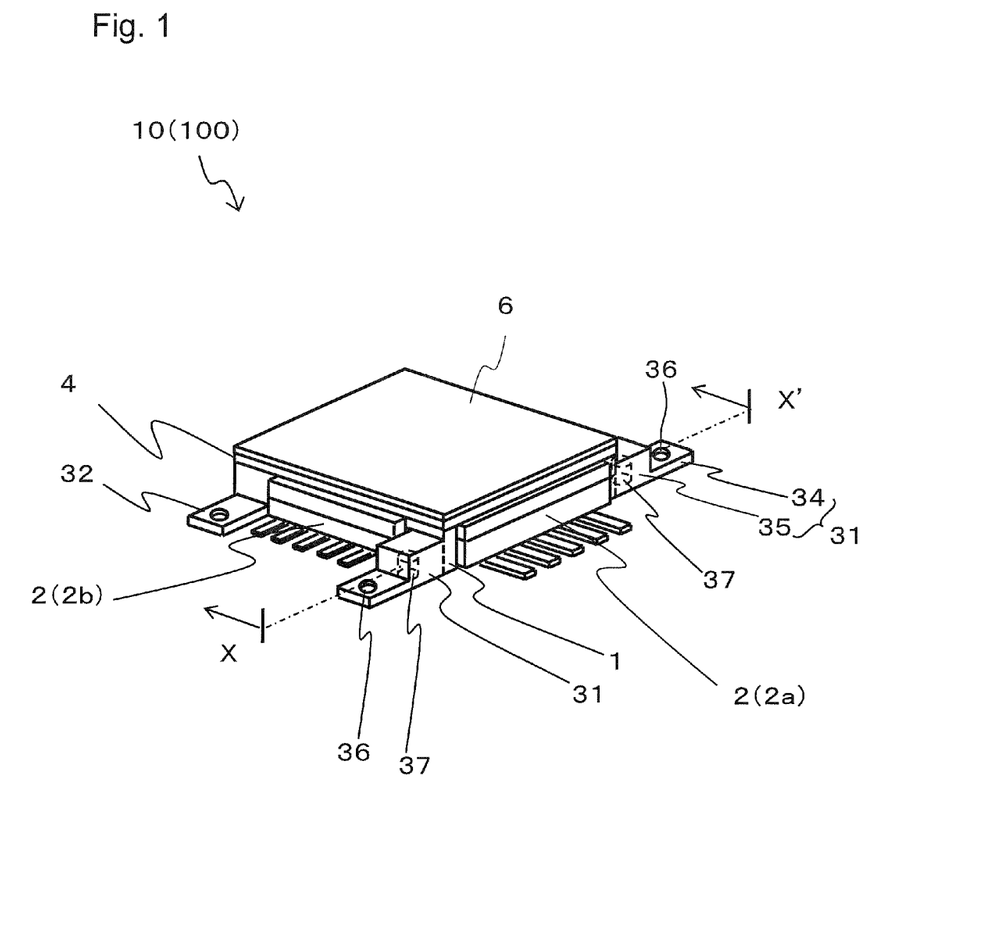
FIG. 1 is a perspective view which shows a package for housing electronic component and an electronic device using the same according to one embodiment of the present invention.
Figure 2:
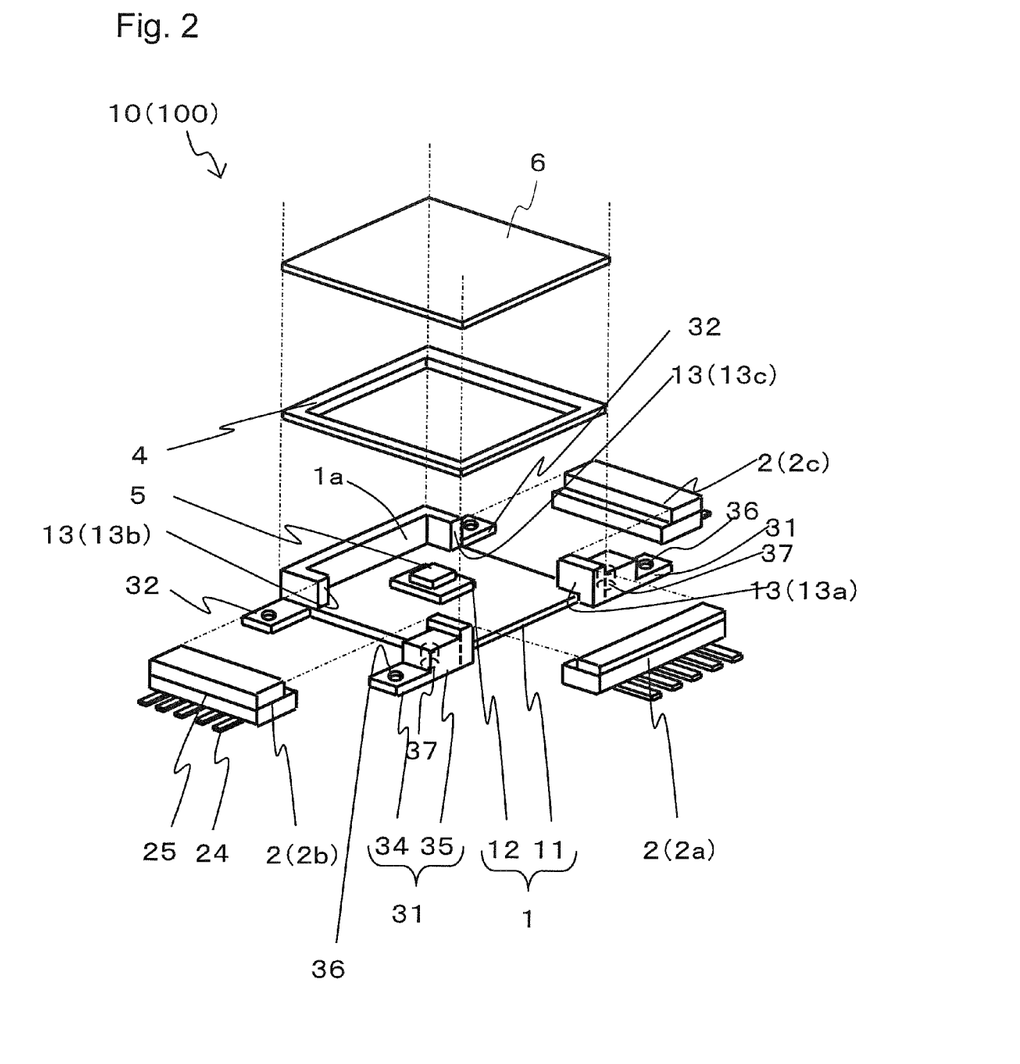
FIG. 2 is an exploded perspective view which shows the package for housing electronic component and the electronic device shown in FIG. 1.
Figure 3:
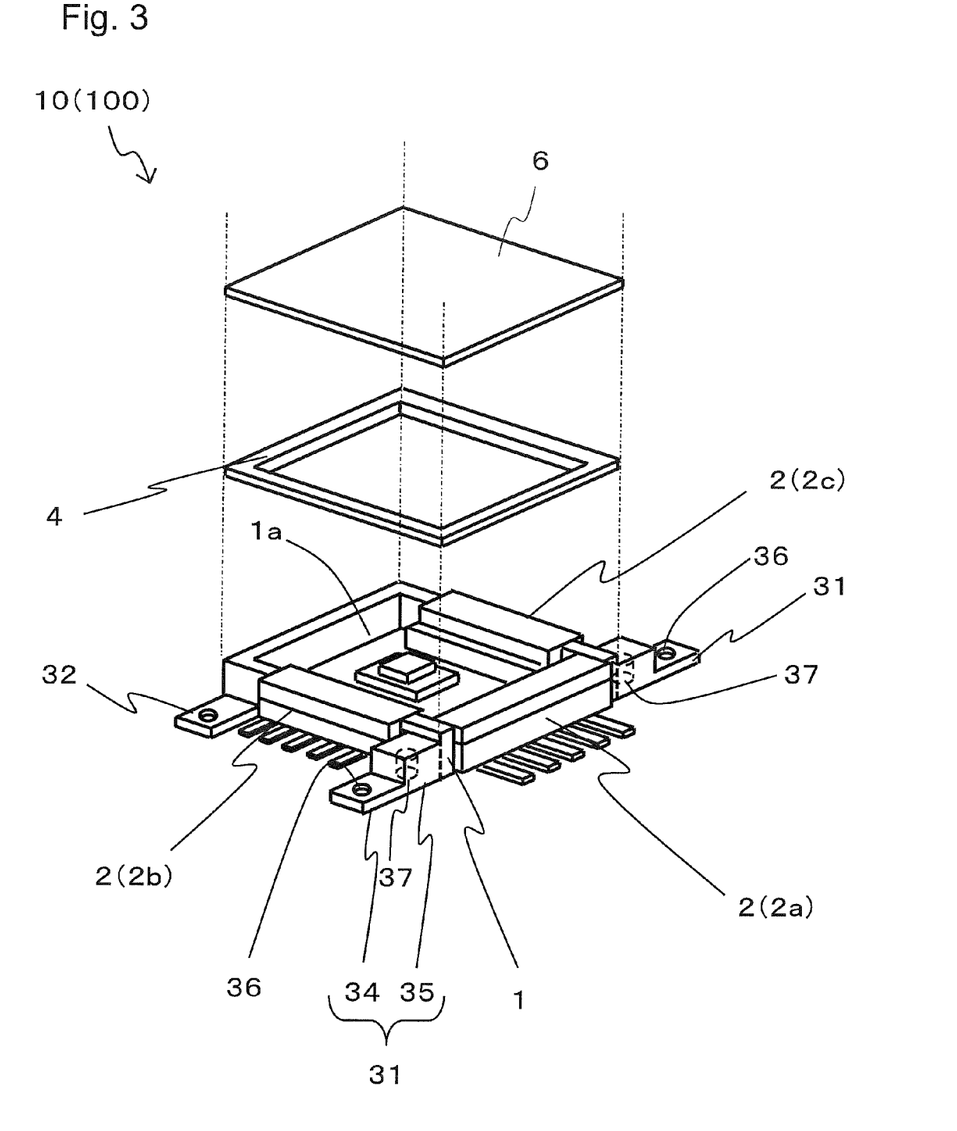
FIG. 3 is another exploded perspective view which shows the package for housing electronic component and the electronic device shown in FIG. 1.
Figure 4:
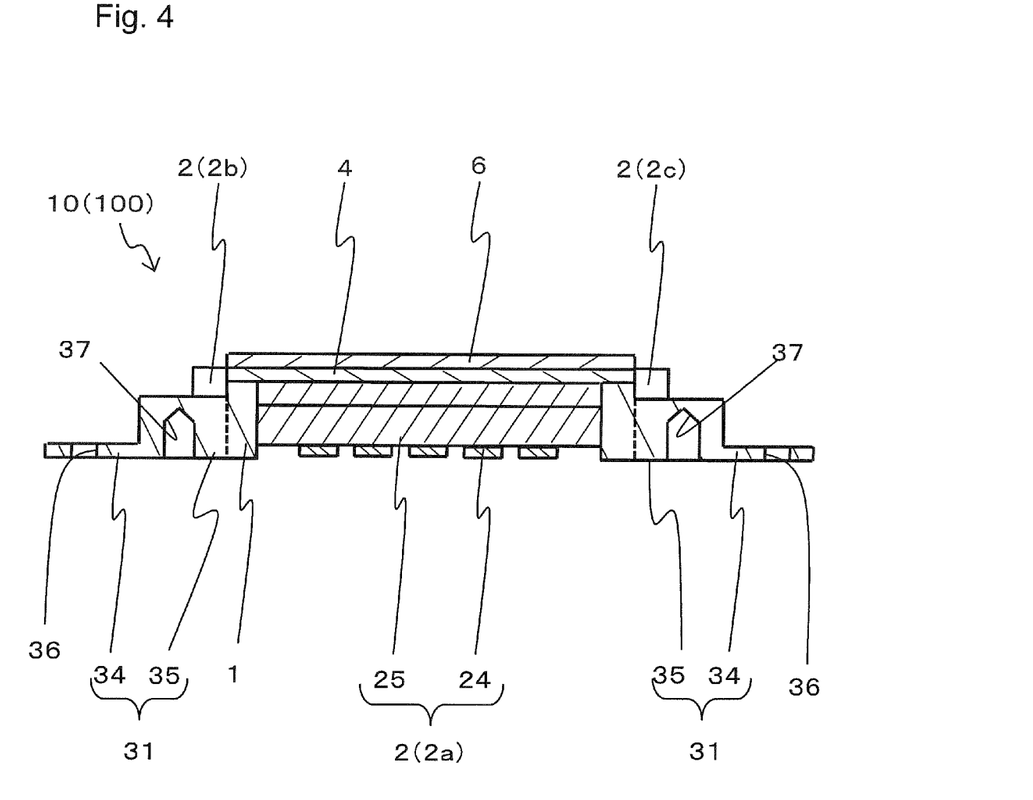
FIG. 4 is a sectional view of the for housing electronic component and the electronic device shown in FIG. 1 taken along the line X-X'.

FIG. 1 is a perspective view which shows a package for housing electronic component 10 according to one embodiment of the present invention. As shown in FIGS. 1 to 5, the package for housing electronic component 10 according to one embodiment of the present invention includes a housing 1 which has an opening on the upper surface and screwing sections 31 which laterally extend from the housing 1. One end of the screwing section 31 is fixed on the side face of the housing 1. Further, input/output terminals 2 are fixed on the housing 1. The input/output terminals 2 are provided as part of the housing 1. Further, a frame 4 may be joined around the opening on the upper surface of the housing 1.

The screwing section 31 includes a thin section 34 which is located on the distal end and is provided with a through hole 36 through which a screw is inserted, and a thick section 35 having a thickness larger than that of the thin section 34 and less than that of the side face of the housing 1 in the vertical up-down direction. In addition, the thick section 35 includes a screw fastening hole 37 in the vertical up-down direction.

The housing 1 together with the frame 4 and a cover 6 hermetically seals an electronic component 5. The housing 1 includes an opening of a recess 1a on the upper surface. The electronic component 5 is mounted in the recess 1a. The housing 1 has a rectangular outer peripheral shape in a plan view. A plurality of notch sections 13 notched from the upper side is disposed on the side face of the housing 1. For example, each notch section 13 is disposed on three of four sides in a plan view. One notch section 13a of three notch sections 13 (13a, 13b, 13c), which is disposed on one side at the center between two other sides, is open to the side face and the lower surface, while the notch sections 13b, 13c on the remaining two sides are open to the side face.

Figure 5:
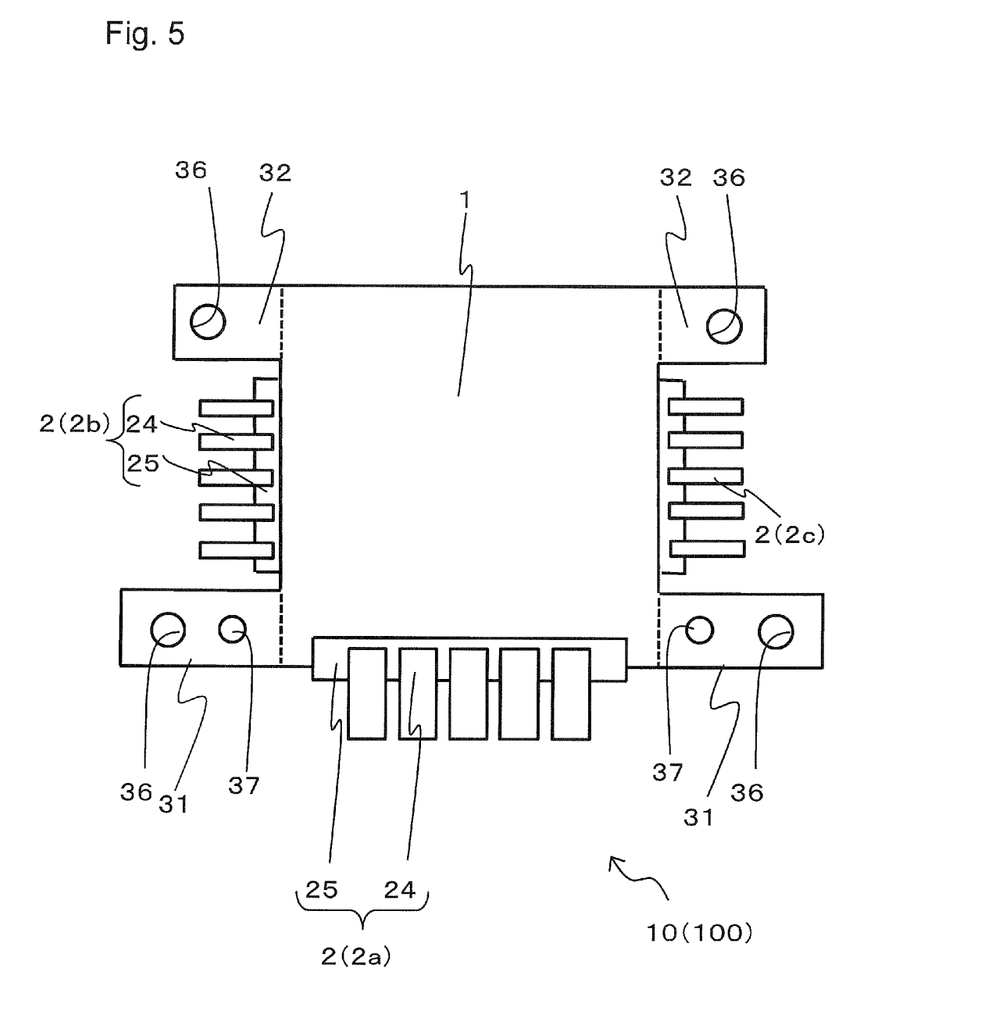
FIG. 5 is a bottom view of the package for housing electronic component and the electronic device shown in FIG. 1.

Each of the input/output terminals 2 are attached to each of a plurality of notch sections 13. The input/output terminals 2 are fitted in the notch sections 13. Further, the input/output terminals 2 are joined to the housing 1 and fixed thereon. The lower surface of the respective input/output terminals 2 is provided with lead terminals 24 which extend to the outside. In a case where the notch section 13 is open to the side face and the lower surface as described above, part of the lead terminals 24 may be placed inside the outer periphery of the housing 1 as shown in FIG. 5. This results in the package 10 reduced in size.

Particularly, when a signal transmitted through the input/output terminals 2 is high frequency signal, it is required to reduce the transmission distance in order to minimize signal loss. In addition to that, since the lead terminals 24 perform electrical connection to external devices, connectivity in mounting the package 10 on an external substrate may be reduced if the length of the lead terminal 24 itself in the signal transmission direction is not long enough. Accordingly, it is desired to decrease the signal transmission distance while ensuring the length of the lead terminal 24. Therefore, it is advantageous to place part of the lead terminal 24 inside the outer periphery of the housing 1. As a result, the signal transmission distance can be decreased while ensuring the length of lead terminal 24. For the foregoing reason, the input/output terminal 2 (2a) for transmitting high frequency signals is provided at the notch section 13 (13a) which is open to both the side face and the lower surface. Further, the input/output terminals 2 (2b, 2c) for low frequency electric signals used for supplying power or the like are each provided at two notch section 13 (13b, 13c) which are open to the side face.

Since the housing 1 houses the electronic component 5, high insulation property is required. In the housing 1, a mounting substrate 12 having an insulation property is disposed on a metal member 11. The metal member 11 has high heat dissipation property. Accordingly, with the above configuration, the heat dissipation property of the electronic component 5 may be improved while the insulation property of the electronic component 5 may also be improved. Further, the electronic component 5 is mounted on the upper surface of the mounting substrate 12.

Specifically, a metal material such as iron, copper, nickel, chrome, cobalt and tungsten may be used as a material of the metal member 11. Alternatively, an alloy or composite of those metal materials may be used. The metal member 11 that forms the housing 1 may be manufactured by a metal processing method such as rolling and punching of an ingot of those metal materials. The housing 1 and the screwing section 31 are integrally formed.

Further, a ceramic material such as aluminum oxide, mullite based, silicon carbide based, aluminum nitride based and silicon nitride based sintered material may be used as a material of the mounting substrate 12. Alternatively, a glass ceramic material may be used instead of those ceramic materials.

The input/output terminals 2 electrically connect the inside and outside of the housing 1. The input/output terminals 2 are fitted in the notch sections 13 while being partially placed on the lower surface of the housing 1. Part of the input/output terminals 2 extends from the side face of the housing 1 as seen in a plan view. The input/output terminal 2 is composed of a wall section 25, signal lines and lead terminals 24. The wall section 25 is a cuboid member made of an insulation material and has a step section on the upper surface of a portion located inside of the housing 1. The signal lines are provided from the surface of the step section of the wall section 25 to the lower surface of a portion located outside of the housing 1. The lead terminals 24 are disposed on a portion which is located on the lower surface of the wall section 25 and outside of the housing 1. The lead terminals 24 are electrically connected to the signal lines. The signal lines of the input/output terminal 2 exposed on the surface of the step section and the electronic component 5 are electrically connected to each other. This connection can be established, for example, via a bonding wire. According to the above configuration, electric signals can be transmitted between the electronic component 5 and the outside of the package 10.

A dielectric member having good insulation property is preferably used for the wall section 25 of the input/output terminal 2. For example, a ceramic material such as aluminum oxide based sintered material having a relative dielectric constant in the order of 9.4, mulllite based sintered material having a relative dielectric constant in the order of 7.5, silicon carbide based sintered material having a relative dielectric constant in the order of 40, aluminum nitride based sintered material having a relative dielectric constant in the order of 8.5 and silicon nitride based sintered material having a relative dielectric constant in the order of 9.6, or a glass ceramic material is used for the wall section 25. In order to successfully transmit signals via the wiring conductor, the wall section 25 is made of a material such as the above dielectric materials having a relative dielectric constant in the order of 4 to 50.

The frame 4 is provided to continuously cover the upper part of the input/output terminals 2 and the upper part of the housing 1. The frame 4 is a frame-shaped member and has a rectangular inner peripheral shape and outer peripheral shape in a plan view. The frame 4 is provided along the opening. The frame 4 is joined to the input/output terminals 2 and the metal portion 11. A metal material such as iron, copper, nickel, chrome, cobalt and tungsten may be used as a material of the frame 4. Alternatively, an alloy or composite of those metal materials may be used. The frame 4 facilitates joining of the cover 6.

The screwing sections 31 fix the housing 1 on the external substrate. The screwing sections 31 laterally extend from the housing 1. The screwing sections 31 are disposed at both ends of a side of the housing 1 where the input/output terminal 2 (2a) for transmitting high frequency signals is disposed in between.

The screwing section 31 is a plate member and includes the thin section 34 and the thick section 35. The thin section 34 is provided with the through hole 36 through which a screw is inserted. The through hole 36 is open to the upper surface and the lower surface of the thin section 34.

As a dimension of the screwing section, for example, a thickness of the thin section 34 may be 0.5 to 2 mm and a thickness of the thick section 35 may be 2.5 to 8 mm. In this case, the thickness of the side face of the housing 1 is 3 to 10 mm and is larger than that of the thick section 35. Further, a diameter of the through hole 36 may be 1 to 5 mm. The thick section 35 includes a screw fastening hole 37 having a diameter of 0.5 to 5 mm.

In the for housing electronic component 10, since the screwing section 31 includes the thin section 34 having the through hole 36, the thick section 35 having a thickness smaller than that of the side face of the housing 1 in the vertical (up-down) direction and larger than that of the thin section 34 in the vertical direction, and the screw fastening hole 37 which extends in the vertical direction of the thick section 35, the warpage of the housing 1 is corrected and heat dissipation to the external substrate is improved. Specifically, when the through hole 36 of the package 10 is attached to the external substrate by using a screw, the thin section 34 slightly deforms so that the warpage of the housing 1 is generally corrected along the external substrate while the housing 1 is fastened to the external substrate.

Then, when the hole 37 is fastened by using a screw, the warpage of the housing 1 is further corrected at the proximal end of the screwing section 31, the housing 1 is fastened to the external substrate. The screwing section 31 is fixed on the external substrate so as to be parallel to the external substrate. Since the warpage of the housing 1 is corrected and the contact area to the external substrate increases, heat dissipation from the housing 1 to the outside is improved. Further, since the screwing section 31 is generally in close fit with the external substrate when fixed on the external substrate, heat dissipation from the screwing section 31 to the external substrate is also improved.

Further, since the thick section 35 has a thickness smaller than that of the side face of the housing 1 in the vertical direction, the step section is provided between the upper surface of the housing 1 above the thick section 35 and the upper surface of the thick section 35. Therefore, when the frame 4 is joined to the upper surface of the side face of the housing 1 by using joining material such as brazing material, the brazing material is prevented from flowing on the upper surface of the thick section 35, thereby preventing the frame 4 from being displaced toward the upper surface of the thick section 35. As a result, the frame 4 is placed at a desired position on the upper surface of the housing 1 and joined thereto.

The screw fastening hole 37 may be a hole 37 which penetrates the thick section 35 in the vertical direction. For example, a screw may be inserted through the hole 37 from the upper opening of the thick section 35 and fixed on the external substrate. However, a screw is preferably inserted from the underside of the through hole of the external substrate into the opening of the hole 37 which is disposed on the lower surface of the thick section 35 and is fixed thereto. By fastening the screw to the thick section 35, the thick section 35 can be securely fastened to the external substrate. Accordingly, the hole 37 is preferably open at least to the lower surface of the thick section 35.

It is more preferable that the hole 37 is a threaded hole 37 having a thread groove on an internal peripheral surface. This facilitates fastening of a screw.

Accordingly, a screw is inserted into the through hole 36 from the upper side and is fixed on the external substrate while a screw is inserted into the hole 37 of the thick section 35 from the underside via the external substrate so that the screwing section 31 is fixed. As a result, fastening ability is improved.

When the thick section 35 is integrally formed with the side face of the housing 1 and the screwing section 31 as shown in FIGS. 1 to 5, fastening force is directly transmitted to the housing 1 when a screw is fastened to the hole 37 of the thick section 35. Accordingly, correction effect of the housing 1 can be improved.

Figure 6:
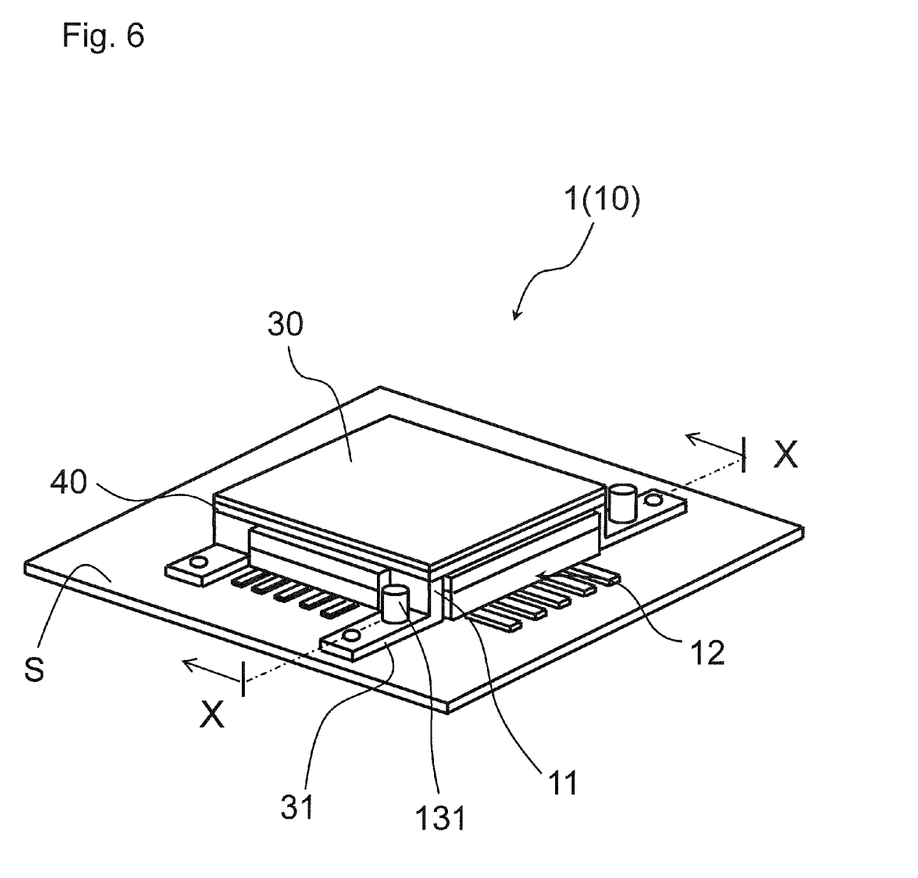
FIG. 6 is a perspective view of the package for housing electronic component and the electronic device according to another embodiment.
Figure 7:
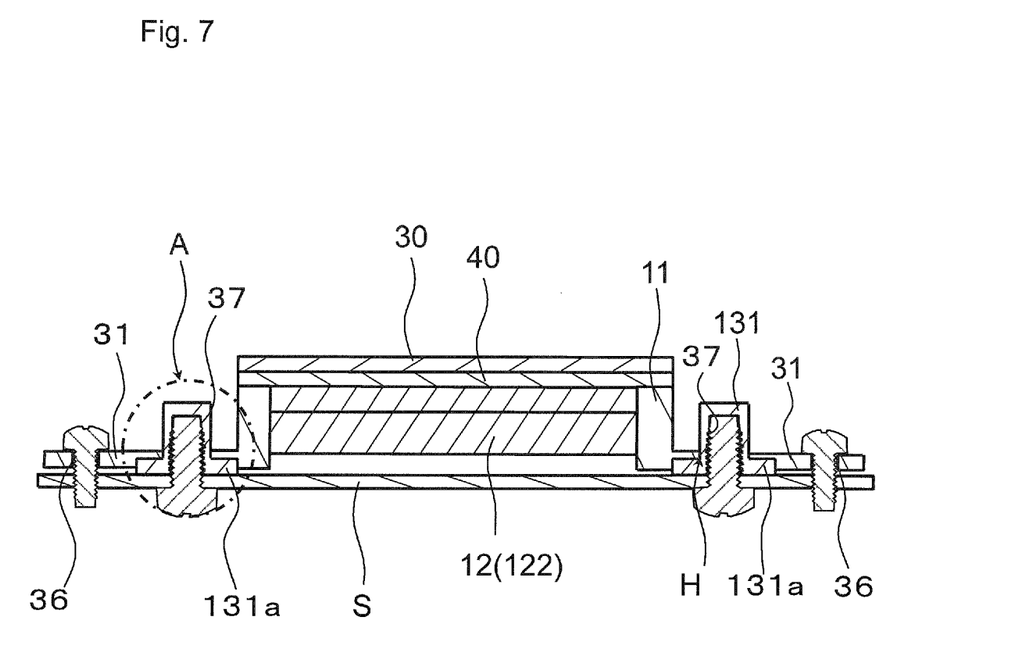
FIG. 7 is a sectional view of the package for housing electronic component and the electronic device shown in FIG. 6 taken along the line X-X'.

However, as shown in FIGS. 6 and 7, a screw fixing member 131 may be attached to the screwing section 31. The screw fixing member 131 is fitted in a through hole H which is disposed between the thin section 34 of the screwing section 31 and the side face of the housing 1 and is joined by using joining material such as brazing material. The screw fixing member 131 is provided with the threaded hole 37. A screw is fastened to the screw fixing member 131 from the lower surface of the external substrate so that the screwing section 31 is fastened to the external substrate. As a result, the housing 1 is fixed on the external substrate with the warpage being corrected, thereby improving heat dissipation from the housing 1.

The screw fixing member 131 includes a clinch section 131a formed of a lower edge that extends outward from the screw fixing member 131 so that the lower edge abuts against the lower surface of the screwing section 31. Accordingly, the screw fixing member 131 can be prevented from being slipped off upward or displaced from the through hole H when joined to the screwing section 31 by using joining material such as brazing material. Further, the thread groove is threaded on the inner surface of the screw fixing member 131 so that a screw is attached from the lower side to the upper side. The screw fixing member 131 can be fixed on the external substrate S by inserting a screw from lower side to the upper side.

As shown in FIG. 7, the clinch section 131a extends for example, 0.1 to 1 mm from a plane along the lower surface of the screwing section 31. The clinch section 131a has a thickness of, for example, 0.5 to 3 mm in the vertical direction. Further, a groove is formed on the lower surface of the screwing section 31 so that the clinch section 131a is fitted in the groove. The clinch section 131a is embedded in the groove and is fitted thereto. Since the clinch section 131a is partially embedded in the lower surface of the screwing section 31, the screw fixing member 131 is prevented from being displaced in the plane direction and the vertical direction. The screw fixing member 131 is prevented from being displaced with respect to the screwing section 31.

Figure 8:
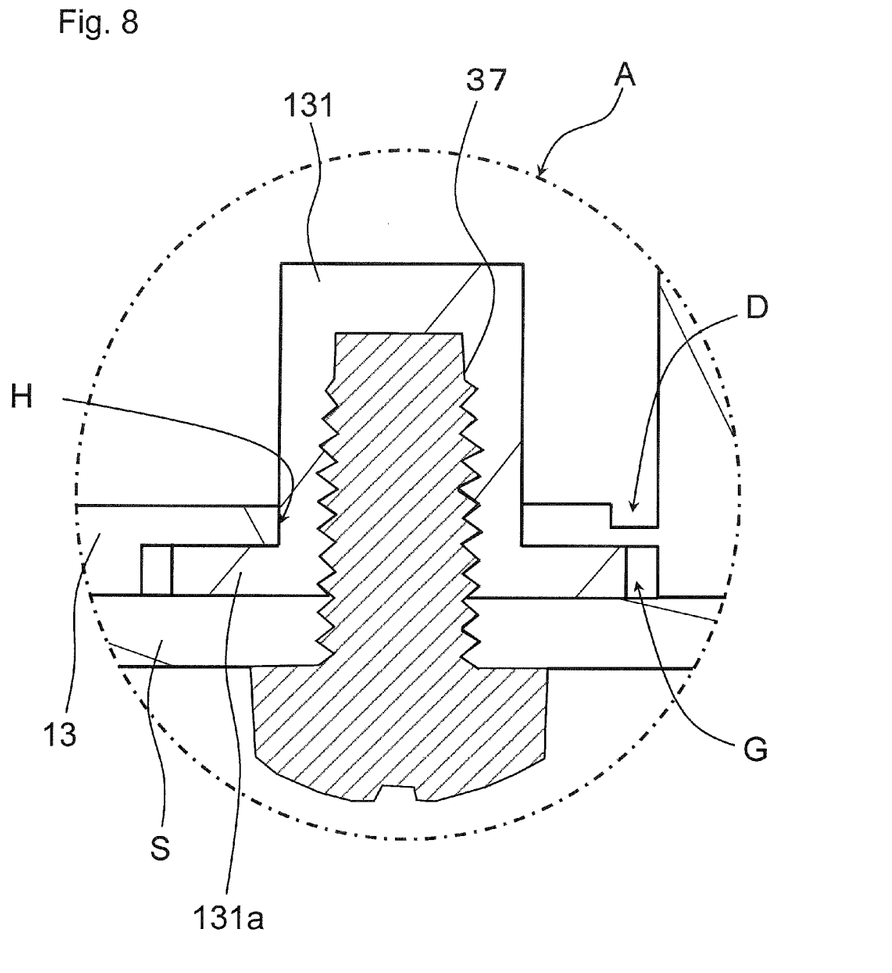
FIG. 8 is a sectional view of a section A shown in FIG. 7 according to another embodiment.

Further, as shown in FIG. 8, the clinch section 131a is preferably sized such that a gap G is formed between the outer periphery of the clinch section 131a and the inner periphery of the groove of the screwing section 31.

The gap G can prevent interference of a force generated between the side face of the screw fixing member 131 and the inner surface of the groove of the screwing section 31. Accordingly, a stress generated at a contact position between the through hole H and the side face of the screw fixing member 131 can be decreased. As a result, when the screw fixing member 131 is fixed on the screwing section 31, the screw fixing member 131 and the screwing section 31 are prevented from being separated. Further, since the gap G is formed between the entire periphery of the lower section of the through hole H and the screw fixing member 131, the screw fixing member 131 and the screwing section 31 are prevented from being separated.

Specifically, a metal material such as iron, copper, nickel, chrome, cobalt and tungsten may be used as a material of the screw fixing member 131. Alternatively, an alloy or composite of those metal materials may be used. The screw fixing member 131 may be manufactured by a metal processing method such as cutting, forging and heading of an ingot or wire material of those metal materials.

Moreover, sub-screwing sections 32 are provided at two of four corners of the housing 1 where the screwing sections 31 are not provided. Unlike the screwing sections 31, the sub-screwing sections 32 do not include a portion which corresponds to the thick section 35. Specifically, the sub-screwing section 32 is a plate member having a through hole 36 through which a screw is inserted and has a length extending from the side face of the housing 1 which is smaller than the length of the screwing section 31 extending from the side face of the housing 1.

<Configuration of Electronic Device 100>

The electronic device 100 includes the package for housing electronic component 10, the electronic component 5 mounted in the package 10, and the cover 6 which is joined to the upper surface of the frame 4 to close the opening.

The electronic component 5 is mounted on the upper surface of the mounting substrate 12. An element such as an optical semiconductor element, an IC (integrated circuit) element and a capacitor may be used as the electronic component 5. The optical semiconductor element may include, for example, a light emitting element such as an LD (laser diode) element or a light receiving element such as a PD (photodiode) element.

The electronic component 5 is electrically connected to the wiring conductor of the input/output terminal 2 via a bonding wire. The electronic component 5 is electrically connected to an external wiring conductor via the bonding wire, the wiring conductor, the lead terminals 24 and the like.

The cover 6 is joined to the upper surface of the frame 4. The cover 6 is joined to the upper surface of the frame 4 to close the opening of the recess 1a. Accordingly, the electronic component 5 is hermetically sealed. By hermetically sealing the electronic component 5, deterioration of the electronic component 5 due to long time usage of the electronic device 100 can be prevented.

A metal material such as iron, copper, nickel, chrome, cobalt and tungsten may be used as a material of the cover 6. Alternatively, an alloy or composite of those metal materials may be used.

The frame 4 and the cover 6 are directly joined together. For example, the frame 4 is a metal frame having a shape that overlaps the cover 6 in a plan view and is also called as a so-called seal ring.

The electronic device 100 according to this embodiment has improved heat dissipation to the external substrate. Accordingly, when the electronic component 5 having high output is housed, the electronic component 5 can be protected and is allowed to function satisfactory.

Further, the present invention is not limited to the aforementioned embodiments, and various alterations and modifications are possible without departing from the spirit of the present invention.

For example, although the housing 1 has been described as being formed by the metal member 11 and the mounting substrate 12 in this embodiment, the invention is not limited thereto. Specifically, the housing 1 may be formed only by an insulation member. A ceramic material such as aluminum oxide based, mullite based, silicon carbide based, aluminum nitride based and silicon nitride based sintered material may be used as a material of the insulation member. Alternatively, the housing 1 may be formed only by a metal member.

Further, although the screwing sections 31 and the sub-screwing sections 32 are used as a configuration of screwing in this embodiment, the invention is not limited thereto. Specifically, the screwing sections 31 may be used at all the four corners. Alternatively, the screwing section 31 may be disposed at one of the four corners and the sub-screwing sections 32 may be disposed at the remaining three corners.

Further, although the screwing sections 31 and the sub-screwing sections 32 are provided at four positions in this embodiment, the invention is not limited thereto. Specifically, one, two, three or five or more positions may be also possible. In addition, the screwing sections 31 may not be necessarily provided at the corners, and the positions of the screwing sections 31 may be appropriately decided.

Further, although the housing 1 has a rectangular shape in a plan view in this embodiment, the invention is not limited thereto. Specifically, the housing 1 may have a polygonal shape or a circular shape.

Further, although the screwing section 31 and the housing 1 has been described as being integrally formed in this embodiment, the invention is not limited thereto. Specifically, the housing 1 and each of a plurality of screwing sections 31 may be individually formed and joined together.

REFERENCE SIGNS LIST 1 housing
11 metal member
12 mounting substrate
13 (13a, 13b, 13c) notch section
2 (2a, 2b, 2c) input/output terminal
24 lead terminal
25 wall section
31 screwing section
32 sub-screwing section
34 thin section
35 thick section
36 through hole
37 hole
4 frame
5 electronic component
6 cover
10 package for housing electronic component (package)
100 electronic device

The invention claimed is:

1. A package for housing an electronic component, comprising:
　a housing in which an electronic component is to be mounted in a recess having an opening on an upper surface; and
　a screwing section that is fixed on a side face of the housing and extends in a lateral direction,
　wherein the screwing section includes a thin section which is located on a distal end and is provided with a through hole through which a screw is inserted, a thick section which connects the thin section to the side face of the housing and has a thickness that is less than a thickness of the side face of the housing in the vertical direction and greater than a thickness of the thin section in the vertical direction, and a screw fastening hole which extends in the vertical direction in the thick section.

2. The package according to claim 1, wherein the thick section is integrally formed with the side face of the housing and the screwing section.

3. The package according to claim 1, wherein the screw fastening hole is open to the lower surface of the thick section.

4. The package according to claim 1, wherein the screw fastening hole is a threaded hole having a thread groove.

5. An electronic device comprising:
   the package according to claim 1;
   an electronic component which is mounted in the recess of the package for housing electronic component; and
   a cover which is joined to an upper surface of the housing to close the opening.

6. The package according to claim 1, wherein the thin section is directly connected to the thick section.

* * * * *